(12) United States Patent
Wittebrood et al.

(10) Patent No.: US 9,486,881 B2
(45) Date of Patent: Nov. 8, 2016

(54) ALUMINIUM ALLOY SHEET PRODUCT OR EXTRUDED PRODUCT FOR FLUXLESS BRAZING

(71) Applicant: ALERIS ROLLED PRODUCTS GERMANY GMBH, Koblenz (DE)

(72) Inventors: Adrianus Jacobus Wittebrood, Velserbroek (NL); Steven Kirkham, Ransbach-Baumbach (DE); Achim Bürger, Höhr Grenzhausen (DE); Klaus Vieregge, Nauort (DE)

(73) Assignee: ALERIS ROLLED PRODUCTS GERMANY GMBH, Koblenz (DE)

( * ) Notice: Subject to any disclaimer, the term of this patent is extended or adjusted under 35 U.S.C. 154(b) by 86 days.

(21) Appl. No.: 14/355,272

(22) PCT Filed: Nov. 9, 2012

(86) PCT No.: PCT/EP2012/072280
§ 371 (c)(1),
(2) Date: Apr. 30, 2014

(87) PCT Pub. No.: WO2013/068539
PCT Pub. Date: May 16, 2013

(65) Prior Publication Data
US 2014/0246483 A1 Sep. 4, 2014

(30) Foreign Application Priority Data
Nov. 11, 2011 (EP) ...................................... 11188842

(51) Int. Cl.
| | | |
|---|---|---|
| B23K 3/00 | (2006.01) | |
| B23K 1/00 | (2006.01) | |
| B23K 35/00 | (2006.01) | |
| B23K 35/22 | (2006.01) | |
| B23K 35/02 | (2006.01) | |
| B23K 35/28 | (2006.01) | |
| C22C 21/00 | (2006.01) | |
| C22C 21/02 | (2006.01) | |
| B23K 35/26 | (2006.01) | |
| B32B 15/01 | (2006.01) | |
| B21C 23/00 | (2006.01) | |
| C23C 4/06 | (2016.01) | |
| C23C 14/16 | (2006.01) | |
| C23C 16/06 | (2006.01) | |
| C25D 3/54 | (2006.01) | |
| C25D 3/56 | (2006.01) | |

(52) U.S. Cl.
CPC .......... *B23K 35/0238* (2013.01); *B21C 23/002* (2013.01); *B23K 1/00* (2013.01); *B23K 35/002* (2013.01); *B23K 35/264* (2013.01); *B23K 35/286* (2013.01); *B32B 15/017* (2013.01); *C22C 21/00* (2013.01); *C22C 21/02* (2013.01); *C23C 4/06* (2013.01); *C23C 14/16* (2013.01); *C23C 16/06* (2013.01); *C25D 3/54* (2013.01); *C25D 3/56* (2013.01); *B23K 2201/14* (2013.01); *Y10T 428/12681* (2015.01)

(58) Field of Classification Search
CPC ............ B23K 35/002; B23K 35/0238; B23K 2203/10; B23K 35/286; B23K 1/012; Y10T 428/12764; Y10T 428/12736; B32B 15/01; C22C 21/02; F28F 21/084
USPC ......... 228/262.51, 262.5, 262.1, 262.9, 56.3; 428/650, 654
See application file for complete search history.

(56) References Cited

U.S. PATENT DOCUMENTS

| | | |
|---|---|---|
| 2003/0098338 A1 | 5/2003 | Dockus et al. |
| 2003/0099856 A1 | 5/2003 | Takeno et al. |
| 2006/0102696 A1 | 5/2006 | Graham et al. |
| 2012/0177947 A1 | 7/2012 | Abrahamsson et al. |

FOREIGN PATENT DOCUMENTS

| | | |
|---|---|---|
| EP | 1306207 A1 | 5/2003 |
| WO | 2011034496 A2 | 3/2011 |

OTHER PUBLICATIONS

International Preliminary Report on Patentability of May 13, 2014 for PCT International Application No. PCT/EP2012/072280, International Filing Date Nov. 9, 2012.
International Search Report mailed Jan. 21, 2013 for International Patent Application No. PCT/EP2012/0072280 to Wittebrood et al having an International filed of Nov. 9, 2012.

*Primary Examiner* — Erin Saad
(74) *Attorney, Agent, or Firm* — Vorys, Sater, Seymour and Pease LLP

(57) ABSTRACT

An aluminum alloy sheet product or extruded product for fluxless brazing, including an aluminum alloy core having on at least one face an aluminum filler clad layer containing 4% to 15% of Si, the filler clad layer having an inner-surface and an outer-surface, the inner-surface is facing the aluminum alloy core and the outer-surface is facing a coating layer of 2 to 45 mg/sq·m of Bi or of a Bi-based alloy. Furthermore, a method of brazing a brazed assembly incorporating at least one member made from the brazing sheet material.

20 Claims, No Drawings

ALUMINIUM ALLOY SHEET PRODUCT OR EXTRUDED PRODUCT FOR FLUXLESS BRAZING

CROSS-REFERENCE TO RELATED APPLICATIONS

This is a §371 National Stage Application of International Application No. PCT/EP2012/072280 filed on 9 Nov. 2012, claiming the priority of European Patent Application No. 11188842.6 filed on 11 Nov. 2011.

FIELD OF THE INVENTION

The invention relates to an aluminium alloy sheet product or extruded product suitable for fluxless brazing and comprising of an aluminium alloy core having on at least one face an Al—Si filler clad layer. Furthermore, the invention relates to a method of brazing a brazed assembly incorporating at least one member made from the brazing sheet material and/or the extruded material.

BACKGROUND TO THE INVENTION

As will be appreciated herein below, except as otherwise indicated, aluminium alloy designations and temper designations refer to the Aluminium Association designations in Aluminium Standards and Data and the Registration Records, as published by the Aluminium Association in 2011 and are well known to the person skilled in the art.

For any description of alloy compositions or preferred alloy compositions, all references to percentages are by weight percent unless otherwise indicated. The term "up to" and "up to about", as employed herein, explicitly includes, but is not limited to, the possibility of zero weight-percent of the particular alloying component to which it refers. For example, up to about 0.15% Ti may include an alloy having no Ti.

There are various brazing processes in use for the industrial scale manufacturing of heat exchangers.

There is vacuum brazing which is carried out at relatively low atmosphere pressure in the order of about $1 \times 10^{-5}$ mbar or less, and is an essentially discontinuous process and puts high demands on material cleanliness. To obtain the optimum conditions for joining to take place, aluminium alloys commonly used for vacuum brazing contain purposive additions of Mg of 1% or more. The Mg destroys the hard oxide film of the filler alloy when it evaporates from the brazing sheet during brazing, and further the evaporated Mg plays the role as getter that removes oxygen and moisture remaining in the brazing furnace. There is always more magnesium present in the furnace then necessary. The excess magnesium condenses on the cold spots in the vacuum furnace and has to be removed frequently. The capital investment for suitable equipment is relatively high.

NOCOLOK™ (registered trademark) flux brazing has been used as the principal brazing process to braze automotive heat exchangers by many heat exchanger manufacturers. Major problems that have arisen from the NOCOLOK process have been flux costs, flux handling and the damage flux causes to the furnaces. Also, in complex shaped assemblies the application of the brazing flux prior to brazing at the interior of the assemblies is often considered very difficult and problematic. Consequently, most of the heat exchanger manufacturers have been trying to reduce flux consumption.

Another brazing process is controlled atmosphere brazing ("CAB") without using a brazing flux.

European patent document EP-1430988-A discloses that for such a process of CAB without using a brazing flux the brazing sheet product used contains Mg at least in a layer constituting the brazing sheet other than the filler alloy layer, typically the core alloy contains Mg in a range of 0.05% to 1.0 wt. %. Interposed between the core alloy and the filler alloy there is present a diffusion prevention layer such a Mg-free AA3003-series aluminium alloy.

European patent document EP-1306207-B1 discloses another fluxless brazing process in an inert gas atmosphere containing a very low oxygen content. Furthermore there is disclosed a brazing sheet product comprising of an aluminium core alloy on one or both sides clad with an Al—Si alloy brazing alloy containing 0.1-5% of Mg and 0.01-0.5% of Bi as an intermediate layer, and a thin covering material clad onto the Al—Si alloy brazing alloy. It is disclosed that during a brazing operation the brazing material in the intermediate layer is molten as the temperature is elevated during brazing, but oxidation of the surface of the brazing material does not occur because the surface is covered with the thin covering material which remains solid. When the temperature is further elevated, the portions with lower melting points, such as a segregation portion of the thin covering material close to the molten brazing material, are locally molten, and then the brazing material seeps and spreads over the surface of the thin covering material due to volumetric expansion. The surface of the brazing material then becomes an emerging face without an oxidation film, and new intensive oxidation does not proceed due to the inert gas atmosphere.

An alternative approach to EP-1306207 is disclosed in each of international application WO-2008/155067, WO-2010/000666 and WO-2010/052231, and in the preferred embodiments having the combined addition of Mg and a wetting element, preferably Bi, to the Al—Si filler alloy.

There is a need for further improved brazing processes and brazing sheet materials or extruded materials for use therein.

DESCRIPTION OF THE INVENTION

It is an object of the invention to provide an aluminium alloy brazing sheet material and/or extruded material that can be applied in a controlled atmosphere brazing process without applying a brazing flux.

This and other objects and further advantages are met or exceeded by the present invention and providing an aluminium alloy sheet product and/or extruded product for fluxless brazing, comprising of an aluminium alloy core having on at least one face an aluminium filler clad layer containing 4% to 15% of Si, the filler clad layer having an inner-surface and an outer-surface, the inner-surface is facing the aluminium alloy core and the outer-surface is facing a coating layer of 2 to 45 mg/sq·m (mg/m$^2$) of Bi or of a Bi-based alloy.

DETAILED DESCRIPTION OF PREFERRED EMBODIMENTS

For the purposes of this invention, and as used hereinafter, Bi-based alloy means an alloy having Bi as its main constituent in an amount of at least 70% Bi, and preferably at least 90% Bi.

Furthermore, for the purposes of this invention, and as used hereinafter, the term "controlled atmosphere brazing" or "CAB" refers to a brazing process which utilizes an inert atmosphere, for example, nitrogen, argon or helium in the brazing of alloy articles, and is distinct from vacuum brazing in particular in that with CAB the brazing atmosphere in the furnace during the brazing operation is at about regular atmospheric pressure, although a slight under-pressure (for example working at a pressure of 0.1 bar or more) or having a slight over-pressure can be used to facilitate the control of the inert atmosphere and to prevent an influx of oxygen containing gas into the brazing furnace. "Core" means an aluminium alloy, e.g. a sheet or an extrusion, which is the structural support for the aluminium alloy that is used as the filler. "Filler" means an aluminium-silicon alloy which is used to braze the core or other aluminium articles. "Cladding" is used to describe the use of the filler without the applied Bi or Bi-based alloy layer when it is overlaid on one or both surfaces of the core, optionally with the application of an intermediate layer between the core and the cladding to act as a diffusion barrier or to improve on the corrosion resistance of the product after brazing. Thereafter, the clad core is called a composite or a brazing sheet. "Fillet" means a concave junction between two surfaces.

In accordance with the invention the brazing sheet and/or extruded material can be applied in a CAB process without applying a brazing flux. It provides for excellent and smooth filler formation during CAB brazing. Furthermore, there is no need to add the Bi to the cladding itself, which overcome the problem of edge-cracking during hot rolling when producing the liner plate when substantial amounts of Bi are present in the Al—Si alloy.

In an embodiment the applied coating layer of Bi or of a Bi-based alloy is at most 30 mg/sq·m.

In an embodiment the applied coating layer of Bi or of a Bi-based alloy is at least 4 mg/sq·m.

In an embodiment the filler clad layer has a composition comprising, in wt. %:
Si about 4% to 15%, preferably about 7% to 13%,
Mg 0 to 1%, preferably 0 to about 0.4%,
Fe 0 to about 1%,
Cu 0 to about 2%,
Mn 0 to about 1.5%,
Zn 0 to about 1.5%, preferably 0 to 0.2%,
Ti 0 to about 0.2%,
Sr 0 to about 0.05%,
the balance aluminium and incidental impurities.
Typical examples of the filler clad layer alloy encompass the known cladding alloys AA4045 and AA4343.

The Si content in the filler alloy should be in the range of about 3% to about 15%, and preferably in the range of about 6% to about 13%. For example, the Si content is about 10% or about 12.5%.

The Mg content in the filler alloy can be up to 1%, and is preferably up to about 0.4%.

The amount of Fe present in the filler alloy depends primarily on the origin of the alloy material and can be present up to about 1%, and preferably is not more than about 0.6%.

The optional addition of Cu and/or Zn results in lowering the solidus temperature of the filler alloy, whereby the solidus temperature is the onset of melting of the filler alloy.

As grain refiner element Ti can be present in the brazing material in a range of up to about 0.2%, preferably up to 0.15%.

Mn can be present in the filler alloy in a range of 0 to about 1.5%. When present as impurity it can be tolerated to 0.3%. However, it may also be purposively added in a range of 0.3% to 1.5%. A more preferred upper-limit for the Mn addition is 1.0%.

The balance is made by unavoidable or incidental impurities, typically each 0.05% maximum, and the total 0.15% maximum, and aluminium.

In an embodiment of the filler alloy it may further comprise Sr in a range of 0 to 0.05% to modify the silicon in the filler alloy and to improve the flowability of the molten filler in the brazing operation.

In a preferred embodiment the filler clad layer is free of each of the elements Na, Li, K, and Ca to avoid any interference with the Bi during the brazing operation. With "free" is meant that no purposeful addition of Na, Li, K, and Ca was made to the chemical composition but that due to impurities and/or leaking from contact with manufacturing equipment, trace quantities of Na, Li, K, and Ca may nevertheless find their way into the filler alloy product.

Furthermore, in a preferred embodiment the filler clad layer is free of each of the elements Bi, Pb, Y, and Sb. With "free" is meant that no purposeful addition of Bi, Pb, Y, and Sb was made to the chemical composition but that due to impurities and/or leaking from contact with manufacturing equipment, trace quantities of Bi, Pb, Y, and Sb may nevertheless find their way into the filler alloy product.

Various techniques may be applied for the application of the coating layer of Bi or Bi-based alloy, such as thermal spraying, chemical vapour deposition ("CVD") and physical vapour deposition ("PVD") and kinetic energy metallization ("KEM") or other techniques for depositing of metal or metal alloys from a gas or vapour phase may be used. PVD is understood to include sputtering, including magnetron sputtering, electron beam (EB) evaporation, and cathodic arc deposition.

However, on a preferred basis the coating layer is applied using plating or electroplating.

In a preferred embodiment of the brazing sheet and/or the extruded component, the 2 to 45 mg/sq·m coating layer of Bi or of a Bi-based alloy is devoid of any further layer comprising one or more metals selected from the group comprising nickel, cobalt, palladium and iron. It is an important feature of the present invention that such metallic layers, e.g., Ni-, Fe-, Pd-, Co-, or alloys thereof, such as for example nickel-bismuth, nickel-lead-nickel-cobalt, nickel-bismuth-cobalt, nickel-lead-cobalt, nickel-lead-bismuth, and nickel-lead-antimony alloys, are no longer required when the filler alloy of this invention is being used in the controlled atmosphere brazing operation. This leads to considerable costs saving when producing the brazing sheet product. Furthermore, the use of for example a Ni-layer results in a reduced corrosion resistance of the product in the post-braze condition, which disadvantage does not occur in the present invention.

In the brazing sheet material and/or extruded material according to the invention the core alloy layer is made for an aluminium alloy. The aluminium core alloys are preferably from the 1000-, 2000-, 3000-, 5000-, 6000-, 7000-, or 8000-series aluminium alloys, for example an AA1230, AA3003, AA3103, AA3004, AA3005, AA5052, AA6060, AA6063, AA8006 or AA8011-type aluminium alloy.

The brazing sheet material used according to the invention has a typical thickness at final gauge in the range of about 0.02 mm to 4 mm. The brazing sheet material is preferably up to about 350 microns thick at final gauge, and more preferably in a range of about 70 microns to 260 microns thick.

The brazing clad material layer has preferably a thickness which is about 2% to 15% of the entire thickness of aluminium alloy brazing sheet material, e.g. 6% or 8%.

The wall thickness of the extruded material is dependent on the particular shape, the circumscribed circle as well as the aluminium alloy. For thin extruded material the wall thickness is preferably less than 3 mm.

The brazing sheet material and/or extruded material applied for the composite metal structure according to this invention can be manufactured via various techniques. For the brazing sheet material roll bonding is well known in the art and which is preferred. Alternatively the Al—Si brazing alloy layer can be applied onto the core alloy by means of thermal spraying techniques. Or alternatively the core alloy and the Al—Si alloy filler clad material can be manufactured by means of casting techniques, for example as disclosed in each of the international patent documents WO-2004/112992, WO-2010/000553, and WO-2010/114740.

Another aspect of the invention relates to a method of manufacturing an article, such as a heat exchanger, joined by brazing or an assembly of brazed components, comprising the steps of:

(a) providing the components of which at least one is made from an aluminium alloy brazing sheet and/or extruded component described in this description as part of the invention;

(b) assembling the components, such as corrugated fin stock material and other components such as tubes, into an assembly;

(c) brazing the assembly without applying a brazing flux on the assembly of components, and brazing the whole assembly in a controlled inert gas atmosphere at a brazing temperature, typically at a temperature in a range of about 540° C. to 615° C., e.g. about 600° C. or about 590° C., for a period long enough for melting and spreading of a brazing material or filler joining the various components, e.g. a dwell time of 1 to 5 minutes, typically at around 2 or 3 minutes; and whereby typically the oxygen content in the brazing atmosphere should be as low as reasonable possible, and is preferably below about 200 ppm, and more preferably below about 100 ppm, for example at 15 ppm or less;

(d) cooling of the brazed assembly, typically to below about 100° C., e.g. to ambient temperature using for example blown air.

The following example is provided to further illustrate the objectives and advantages of this invention. It is not intended to limit the scope of this invention in any manner, however.

EXAMPLE

Commercial available brazing sheet having an AA3003-series core alloy and on both sides provided with an AA4045 clad layer (each 10% thickness) have been treated in accordance with this invention by applying a Bi-coating onto the clad layer. All samples had been cleaned, etched and desmutted prior to the application of the Bi-coating.

In one comparative example a Bi-coating layer was applied via a zincate immersion treatment. The zincate solution comprised of 40 g/mol sodium hydroxide, 81 g/mol zinc oxide, 282 g/mol potassium sodium tartrate tetrahydrate ("Rochelle salt"), 85 g/mol sodium nitrate, and 466 g/mol bismuth oxide. The material was immersed for 12 s in the zincate solution at room temperature.

In another series of experiments a Bi-layer of varying thickness had been applied via electroplating by varying the current density and the plating time, and which parameters are summarized in Table 1. The Bi-plating bath comprised of ammonium sulphate, trisodium citrate dehydrate, sodium gluconate, and a bismuth concentration based on bismuth oxide ($Bi_2O3$), and had a pH 11.6 at 50° C.

The composition of the resultant plated layer was measured using ICP and is given in Table 1. ICP stands for Induced Coupled Plasma.

Small coupons of 25 mm×25 mm were cut from the Bi-plated sheets. A small strip of an AA3003 alloy measuring 30 mm×7 mm×1 mm was bent in the centre to an angle of 45° and laid on the coupons. The strip-on-the-coupon samples were heated using a laboratory scale quartz furnace under flowing nitrogen of atmospheric pressure and having an oxygen content of less than 20 ppm, with heating from room temperature to 590° C., dwell time at 590° C. for 1 minute, cooling from 590° C. to room temperature. The CAB brazing process was judged on possible formation of wrinkles, capillary depression and fillet formation. An overall assessment was given as poor brazeability, fair brazeability, good brazeability, or excellent brazeability. Excellent means both legs of the reversed angle are fully brazed to the brazing substrate. The results obtained are summarised in Table 1.

TABLE 1

Results of brazing tests and ICP analysis.

| application technique | current density [$A/dm^2$] | time [s] | Zn [$mg/m^2$] | Bi [$mg/m^2$] | brazing result |
|---|---|---|---|---|---|
| zincate immersion treatment | 0 | 12.0 | 250 | 50 | poor |
| electroplating | 1 | 1.0 | — | 24 | excellent |
| electroplating | 1 | 0.5 | — | 21 | excellent |
| electroplating | 1 | 0.2 | — | 11 | excellent |
| electroplating | 0.5 | 1.0 | — | 19 | excellent |
| electroplating | 0.5 | 0.5 | — | 14 | excellent |
| electroplating | 0.5 | 0.2 | — | 9 | excellent |

All samples passed the CAB brazing test except for the sample that is prepared via the zincate immersion treatment. Possibly, zinc is oxidised to some extent, thereby deteriorating the brazing properties. All bismuth electroplated samples showed excellent brazing behaviour in a CAB environment. All bismuth electroplated samples showed excellent brazing behaviour in a CAB environment without the use of any braze-promoting elements or layers based on nickel, cobalt, palladium, and iron, or alloys thereof. Also the requirement for the addition of Mg to the filler alloy is not required in order to achieve excellent brazing behaviour in a CAB environment.

While various embodiments of the technology described herein have been described in detail, it is apparent that modifications and adaptations of those embodiments will occur to those skilled in the art. However, it is to be expressly understood that such modifications and adaptations are within the spirit and scope of the presently disclosed technology.

The invention claimed is:

1. An aluminium alloy brazing sheet product or extruded product for fluxless brazing, comprising:
an aluminium alloy core having on at least one face an aluminium filler clad layer containing 4% to 15% by weight of Si, the aluminium filler clad layer having an inner-surface and an outer-surface,
wherein the inner-surface of the aluminium filler clad layer is facing the aluminium alloy core and the outer-surface of the aluminium filler clad layer is facing a coating layer of 2 to 45 mg/sq·m of Bi or of a Bi-based alloy, and wherein the coating layer of Bi or of Bi-based alloy is not covered or overlaid by any further layer comprising one or more metals selected from the group of nickel, cobalt, and iron.

2. The aluminium alloy sheet product or extruded product according to claim 1, wherein the coating layer is at most 30 mg/sq·m.

3. The aluminium alloy sheet product or extruded product according to claim 1, wherein the coating layer is at least 4 mg/sq·m.

4. The aluminium alloy sheet product or extruded product according to claim 1, wherein the coating layer of Bi or of a Bi-based alloy is a plated layer.

5. The aluminium alloy sheet product or extruded product according to claim 1, wherein the coating layer of Bi or of a Bi-based alloy is not covered or overlaid by any further layer comprising each of nickel, cobalt, palladium, and iron,
wherein the coating layer of Bi or of a Bi-based alloy is not covered or overlaid by any further layer comprising nickel,
wherein the coating layer of Bi or of a Bi-based alloy is not covered or overlaid by any further layer comprising cobalt,
wherein the coating layer of Bi or of a Bi-based alloy is not covered or overlaid by any further layer comprising palladium,
wherein the coating layer of Bi or of a Bi-based alloy is not covered or overlaid by any further layer comprising iron.

6. The aluminium sheet product or extruded product according to claim 1, wherein the filler clad layer has a composition, in wt. %, of:
Si 4% to 15%,
Mg 0 to 1%,
Fe 0 to 1%,
Cu 0 to 2%,
Mn 0 to 1.5%,
Zn 0 to 1.5%,
Ti 0 to 0.2%,
Sr 0 to 0.05%,
the balance aluminium and incidental impurities.

7. A method of manufacturing an article joined by brazing or an assembly of brazed components, comprising the steps of:
(a) providing components of which at least one is made from a brazing sheet material and/or extruded material according to claim 1,
(b) assembling the components into an assembly,
(c) brazing the assembly without applying brazing flux on the assembly of components and brazing the whole assembly in an inert controlled gas atmosphere at a brazing temperature to form a brazed assembly, and
(d) cooling of the brazed assembly.

8. The aluminium alloy sheet product or extruded product according to claim 1, wherein the filler clad layer has a composition, in wt. %, of:
Si 6% to 13%,
Mg 0 to 0.4%,
Fe 0 to 0.6%,
Cu 0 to 2%,
Mn 0.3 to 1.0%,
Zn 0 to 0.2%,
Ti 0 to 0.15%,
Sr 0 to 0.05%,
free of each of elements Na, Li, K, and Ca; and
free of each of elements Bi, Pb, Y, and Sb;
the balance aluminium and incidental impurities.

9. The aluminium alloy sheet product or extruded product according to claim 1, wherein the coating layer of Bi or of a Bi-based alloy is applied by a technique selected from the group of thermal spraying, chemical vapour deposition, physical vapour deposition, and kinetic energy metallization.

10. The aluminium alloy sheet product or extruded product according to claim 9, wherein the physical vapour deposition includes a technique selected from the group of sputtering, electron beam evaporation and cathodic arc deposition.

11. The aluminium alloy sheet product or extruded product according to claim 1, wherein the coating layer of Bi or of a Bi-based alloy is applied using plating or electroplating.

12. The method according to claim 7, wherein the coating layer is at most 30 mg/sq·m.

13. The method according to claim 7, wherein the coating layer is at least 4 mg/sq·m.

14. The method according to claim 7, wherein the coating layer of Bi or of a Bi-based alloy is a plated layer.

15. The method according to claim 7, wherein the coating layer of Bi or of a Bi-based alloy is not covered or overlaid by any further layer comprising each of nickel, cobalt, palladium, and iron.

16. The method according to claim 7, wherein the filler clad layer has a composition, in wt. %, of:
Si 4% to 15%,
Mg 0 to 1%,
Fe 0 to 1%,
Cu 0 to 2%,
Mn 0 to 1.5%,
Zn 0 to 1.5%,
Ti 0 to 0.2%,
Sr 0 to 0.05%,
the balance aluminium and incidental impurities.

17. The method according to claim 7, wherein the filler clad layer has a composition, in wt. %, of:
Si 6% to 13%,
Mg 0 to 0.4%,
Fe 0 to 0.6%,
Cu 0 to 2%,
Mn 0.3 to 1.0%,
Zn 0 to 0.2%,
Ti 0 to 0.15%,
Sr 0 to 0.05%,
free of each of elements Na, Li, K, and Ca; and
free of each of elements Bi, Pb, Y, and Sb;
the balance aluminium and incidental impurities.

18. The aluminium alloy sheet product or extruded product of claim 5:
wherein the aluminium alloy core having on at least one face an aluminium filler clad layer containing 4% to 15% by weight of Si, the aluminium filler clad layer having the inner-surface and the outer-surface,
wherein the inner-surface of the aluminium filler clad layer is facing the aluminium alloy core and the outer-surface of the aluminium filler clad layer is facing the coating layer of 4 to 30 mg/sq·m of Bi or of the Bi-based alloy,
wherein the Bi-based alloy is at least 70% by weight Bi.

19. The aluminium alloy sheet product or extruded product of claim 18, consisting of:
the aluminium alloy core having on at least one face the aluminium filler clad layer, the aluminium filler clad layer having the inner-surface and the outer-surface, wherein the filler clad layer containing, in wt. %, Si 6% to 13%, Mg 0 to 0.4%, Fe 0 to 0.6%, Cu 0 to 2%, Mn 0.3 to 1.0%, Zn 0 to 0.2%, Ti 0 to 0.15%, Sr 0 to 0.05%, free of each of elements Na, Li, K, and Ca; and free of each of elements Bi, Pb, Y, and Sb; the balance aluminium and incidental impurities, wherein the inner-surface of the aluminium filler clad layer is facing the aluminium alloy core and the outer-surface of the aluminium filler clad layer is facing the coating layer of 4 to 30 mg/sq·m of the Bi or of the Bi-based alloy, wherein the Bi-based alloy is at least 90% by weight Bi.

20. The aluminium alloy sheet product or extruded product of claim 18, wherein the filler clad layer contains, in wt. %, Si 10% to 15%.

\* \* \* \* \*